US012641860B2

(12) United States Patent
Pan et al.

(10) Patent No.: US 12,641,860 B2
(45) Date of Patent: May 26, 2026

(54) DEVICE WITH MODIFIED WORK FUNCTION LAYER AND METHOD OF FORMING THE SAME

(71) Applicant: Taiwan Semiconductor Manufacturing Company, Ltd., Hsinchu (TW)

(72) Inventors: Yu-Chi Pan, Zhubei (TW); Kuan-Wei Lin, Tainan (TW); Chun-Neng Lin, Hsin-chu (TW); Yu-Shih Wang, Tainan (TW); Ming-Hsi Yeh, Hsinchu (TW); Kuo-Bin Huang, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 678 days.

(21) Appl. No.: 17/849,154

(22) Filed: Jun. 24, 2022

(65) Prior Publication Data

US 2023/0420538 A1 Dec. 28, 2023

(51) Int. Cl.
| | |
|---|---|
| *H10D 64/66* | (2025.01) |
| *H10D 30/01* | (2025.01) |
| *H10D 30/62* | (2025.01) |
| *H10D 64/01* | (2025.01) |

(52) U.S. Cl.
CPC ......... *H10D 64/667* (2025.01); *H10D 30/024* (2025.01); *H10D 30/6211* (2025.01); *H10D 64/01318* (2026.01)

(58) Field of Classification Search
None
See application file for complete search history.

(56) References Cited

U.S. PATENT DOCUMENTS

| | | | | |
|---|---|---|---|---|
| 11,282,933 | B2* | 3/2022 | Lim | H10D 30/0241 |
| 2007/0048946 | A1* | 3/2007 | Ramaswamy | H01L 21/28088 |
| | | | | 257/E29.255 |
| 2010/0038721 | A1* | 2/2010 | Lin | H10D 84/85 |
| | | | | 257/369 |
| 2014/0291760 | A1 | 10/2014 | Cheng et al. | |
| 2015/0262828 | A1* | 9/2015 | Brand | H10D 30/601 |
| | | | | 438/592 |
| 2015/0357244 | A1* | 12/2015 | Ragnarsson | H10D 84/014 |
| | | | | 438/275 |
| 2018/0040620 | A1* | 2/2018 | Ha | H10D 86/011 |
| 2021/0305411 | A1* | 9/2021 | Savant | H01L 21/32136 |
| 2021/0399102 | A1* | 12/2021 | Lee | H01L 21/28079 |
| 2022/0020861 | A1* | 1/2022 | Lee | H01L 21/28568 |

FOREIGN PATENT DOCUMENTS

| | | |
|---|---|---|
| TW | 202218054 A | 5/2022 |

OTHER PUBLICATIONS

Office Action issued in connection with Taiwan Appl. No. 112123106 dated Jun. 17, 2024.

* cited by examiner

*Primary Examiner* — Benjamin P Sandvik
(74) *Attorney, Agent, or Firm* — Foley & Lardner LLP

(57) ABSTRACT

A semiconductor device includes a plurality of fin structures disposed over a substrate and a work function alloy layer disposed over each fin structure of the plurality of fin structures. The plurality of fin structures includes a first fin structure and a second fin structure. A content of a first element in a first portion of the work function alloy layer, which portion is disposed over the first fin structure, is different from a content of the first element in a second portion of the work function alloy layer, which portion is disposed over the second fin structure.

20 Claims, 19 Drawing Sheets

300

200

200

200

200

200

200

200

200

200

200

300

300

300

300

300

300

300

400

| | |
|---|---|
| Provide substrate | ~402 |
| Form fin structures | ~404 |
| Form isolation regions | ~406 |
| Form gate dielectric layer | ~408 |
| Form work function alloy layer | ~410 |
| Modify work function alloy layer | ~412 |
| Form active gate structures | ~414 |

600

600

600

600

600

700

700

700

700

700

DEVICE WITH MODIFIED WORK FUNCTION LAYER AND METHOD OF FORMING THE SAME

BACKGROUND

The present disclosure generally relates to semiconductor devices, and particularly to methods of making a non-planar transistor.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a fin protruding from a substrate. A gate structure, configured to control the flow of charge carriers within a conductive channel of the FinFET device, wraps around the fin. For example, in a tri-gate FinFET device, the gate structure wraps around three sides of the fin, thereby forming conductive channels on three sides of the fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
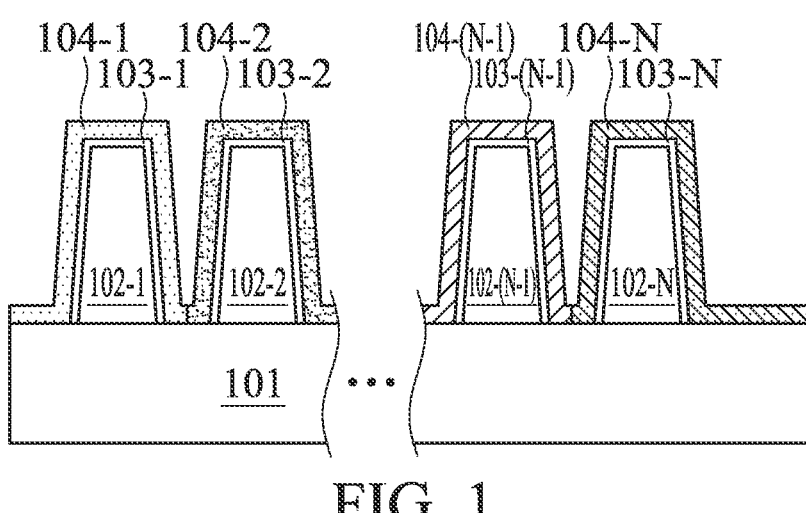
FIG. 1 shows a Fin Field-Effect Transistor (FinFET) device with a work function alloy layer having regions with a different content of an element of the alloy of the work function alloy layer according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a FinFET device, and in particular, in the context of forming a replacement gate of a FinFET device. In the existing technologies, in order to have multiple threshold voltages for respective FinFETs, multiple work function layers are deposited and patterned over fin structures of the FinFET device. Various combinations of one or more of these work function layers then partially function as respective (metal) gate structures of the FinFET device. However, the patterning of the existing technologies may complicated and time-consuming. Furthermore, depositions of multiple work function layers, usually involving atomic layer deposition techniques, may result in high cost. In addition, the existing technologies may not be compatible with smaller critical dimensions in FinFET devices, such as a smaller trench critical dimension in a FinFET device. Although embodiments of the present disclosure are discussed in the context of forming a FinFET device, this disclosure is also applicable to other semiconductor devices, such as Gate-All-Around (GAA) devices, including horizontal GAA (HGAA) devices and vertical GAA (VGAA) devices.

The present disclosure provides various embodiments of a semiconductor device, such as a FinFET device, which is immune from the above-identified issues, and methods to form the same. The present disclosure provides a semiconductor device, such as a FinFET device, which has a plurality of fin structures disposed over a substrate and a work function alloy layer disposed over each of the fin structures. The work function layer includes multiple, i.e. two or more, portions each having a different content of an element of the alloy of the work function alloy layer. Different contents of that element in each of the multiple portions of the work function alloy layer provides each of the multiple portions of the work function alloy layer with a different threshold voltage. Thus, the work function layer having multiple portions each having a different content of an element of the alloy of the work function alloy layer provides the semiconductor device, such as a FinFET device, with multiple threshold voltages.

Figure 3A:
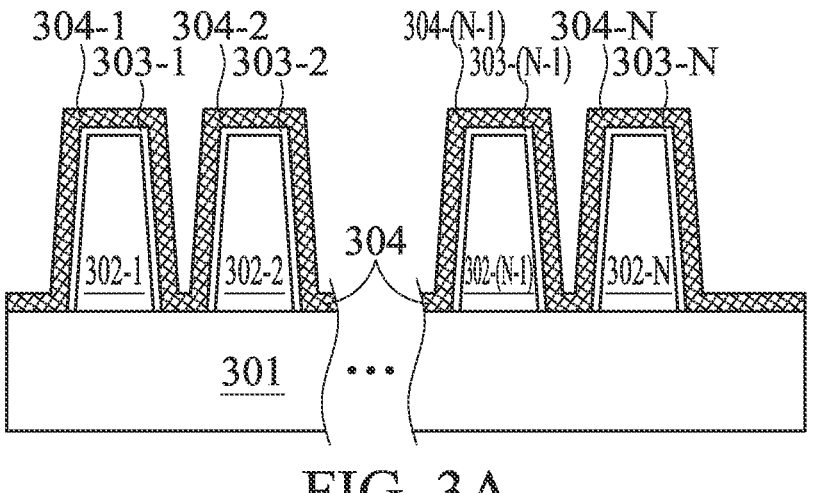
FIG. 3A-3H illustrate producing a work function alloy layer of a FinFET device so that the work function alloy layer has regions with a different content of an element of the alloy of the work function alloy layer according to some embodiments.
Figure 3B:
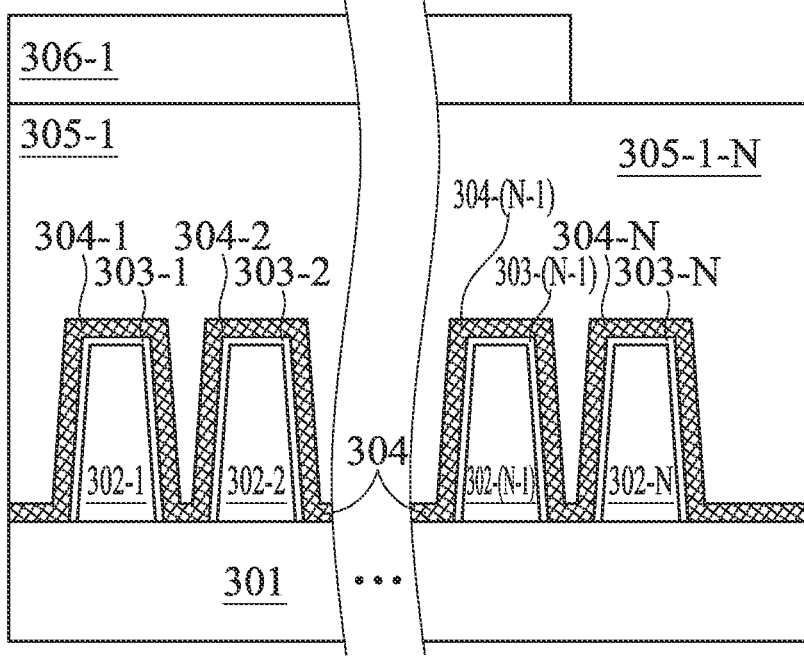
Figure 3C:
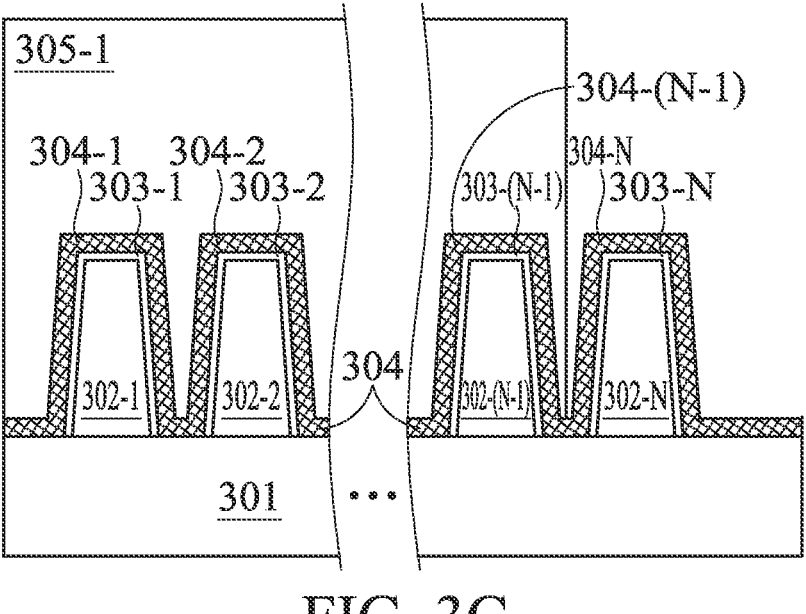
Figure 3D:
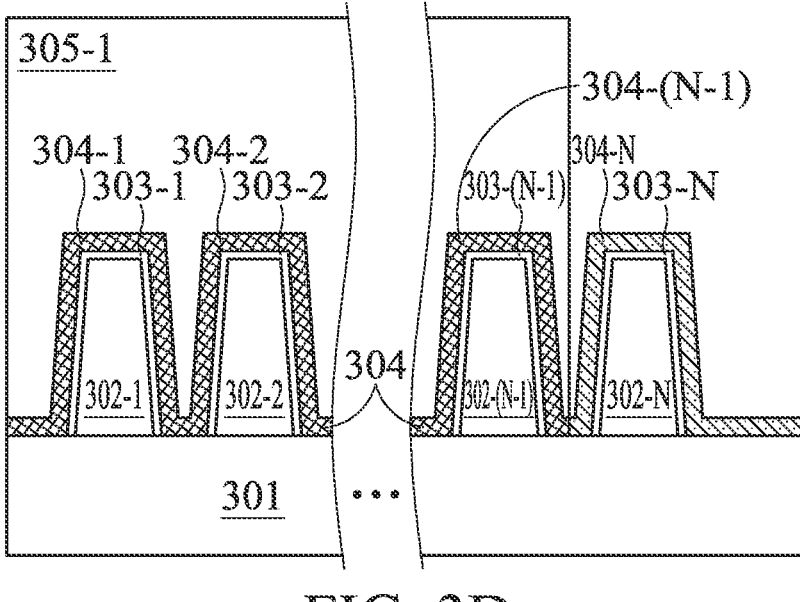
Figure 3E:
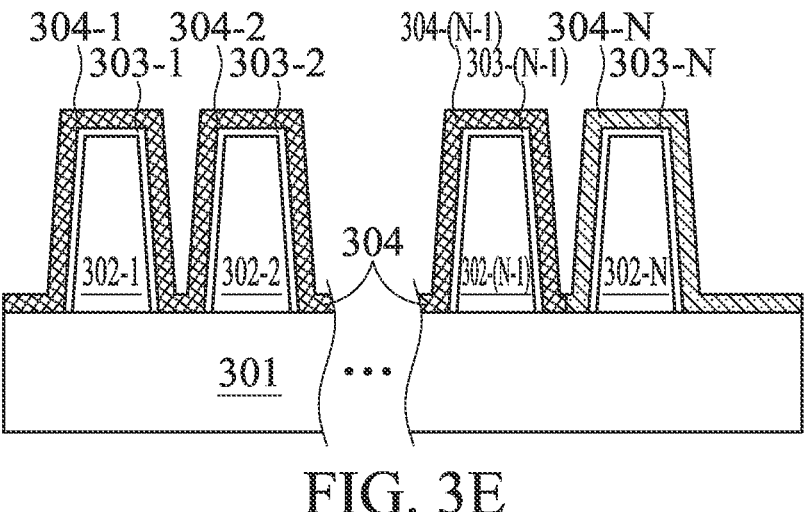
Figure 3F:
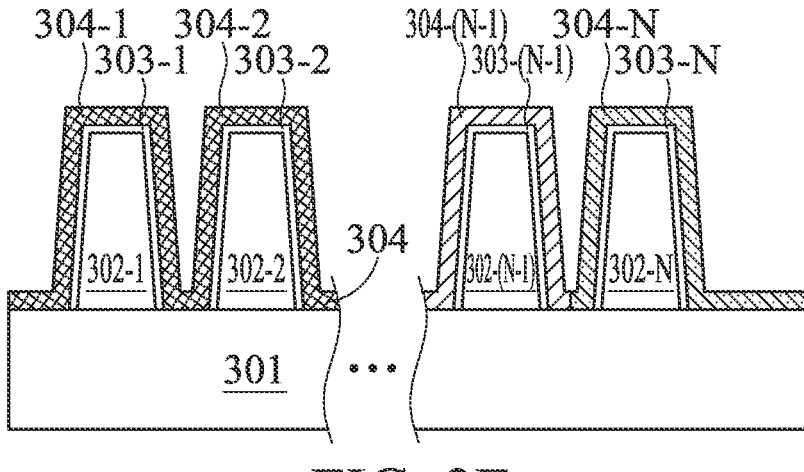
Figure 3G:
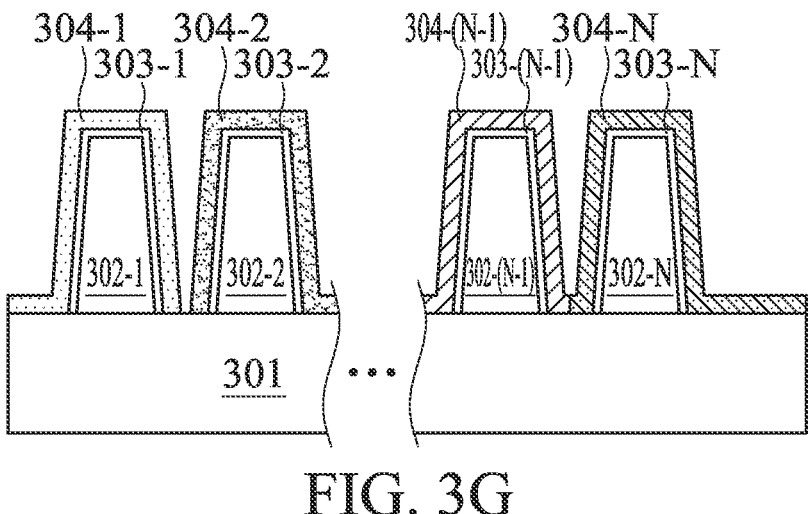
Figure 4:
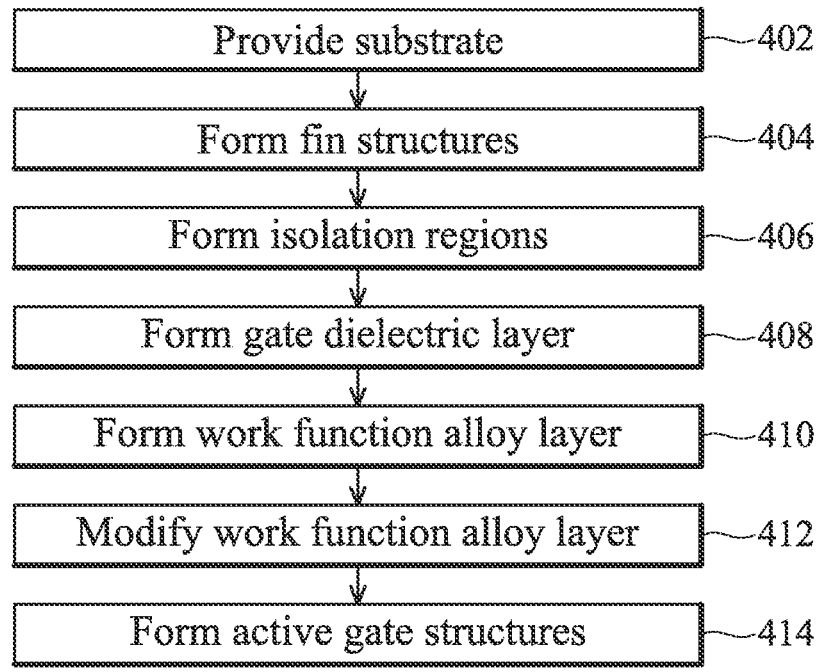
FIG. 4 illustrates a flow chart of an example method for making a non-planar transistor device, in accordance with some embodiments.

The semiconductor device, such as a FinFET device may be manufactured by a process illustrated in FIG. 4. The process may involve one or more of the following operations: providing a substrate, such as a semiconductor substrate (402); forming fin structures on the substrate (404); forming isolation regions (406); forming a gate dielectric layer over the fin structures (408); forming a work function alloy layer over the gate dielectric layer, which is over the fin structures (410); modifying the work function alloy layer to provide it multiple portions, each having a different content of an element of the alloy of the work function alloy layer, through, for example, wet etching each of the portions of the work function alloy layer using different wet etching conditions (412), so that each of the multiple portions has a different threshold voltage; forming active gate structures containing portions of the work function alloy layer with different threshold voltages due to different content of the element of the alloy of the work function alloy layer (414). FIG. 6A-6F provide additional details for operations 402, 404, 406, 408. FIG. 3A-G provide additional details for operations 410, 412 and 414. FIG. 7A-G also provide additional details for some embodiments of operations 410 and 412.

FIG. 1 shows an embodiment of a semiconductor device, such as FinFET device, with a work function layer that includes multiple, i.e. two or more, portions each having a different content of an element of the alloy of the work function alloy layer. FIG. 1 shows semiconductor device 100 which has substrate 101. Substrate 101 has N fin structures, such as fin structures 102-1, 102-2, 102-(N−1) and 102-N. N may be 2, 3, 4, 5 etc. Each of the N fin structures may have a respective gate dielectric layer over its top and side surfaces. For example, fin structure 102-1 has gate dielectric layer 103-1; fin structure 102-2 has gate dielectric layer 103-2; fin structure 102-(N−1) has gate dielectric layer 103-(N−1); fin structure 102-N has gate dielectric layer 103-N. Device 100 includes work function alloy layer 104 deposited over each N fin structures, including fin structures 102-1, 102-2, 102-(N−1) and 102-N. Work function alloy layer 104 includes multiple, i.e. two or more, portions each having a different content of an element of the alloy of the work function alloy layer. For example, FIG. 1 shows portions 104-1, 104-2, 104-(N−1) and 104-N each having a distinct content of a selected element of the alloy of the work function alloy layer, while having the same content or essentially the same (such as within 2% or 1% or 0.5% or 0.2% or 0.1%) for remaining element(s) of the alloy. For instance, portion 104-1 may have a first content of the selected element, portion 104-2 may have a second content of the selected element, which is different from the first content; portion 104-(N−1) may have a third content of the selected element, which is different from each of the first and second contents; portion 104-N may have a fourth content of the selected element, which is different from each of the first, second and third contents. Although FIG. 1 shows four portions 104-1, 104-2, 104-(N−1) and 104-N each having a distinct content of a selected element of the alloy of the work function alloy layer, a number of such portions may be 2, 3, 4, 5, 6, 7, etc. Although FIG. 1 shows the number of portions 104-1, 104-2, 104-(N−1) and 104-N corresponding to the number of fin structures 102-1, 102-2, 102-(N−1) and 102-N, in certain embodiments, a number of portions of the work function alloy layer with a distinct content of the selected element may be different from a number of the fin structures. For example, in some embodiments, a number of portions of the work function alloy layer with a distinct content of the selected element may be greater than a number of the fin structures. Yet in some embodiments, a number of portions of the work function alloy layer with a distinct content of the selected element may be less than a number of the fin structures. In some embodiments, a border between two adjacent portions of the work function alloy layer with a distinct content of the selected element may be in the area between two adjacent fin structures, such as shown in FIG. 1. Yet in some embodiments, a border between two adjacent portions of the work function alloy layer with a distinct content of the selected element may be on one of fin structures.

Figure 2A:
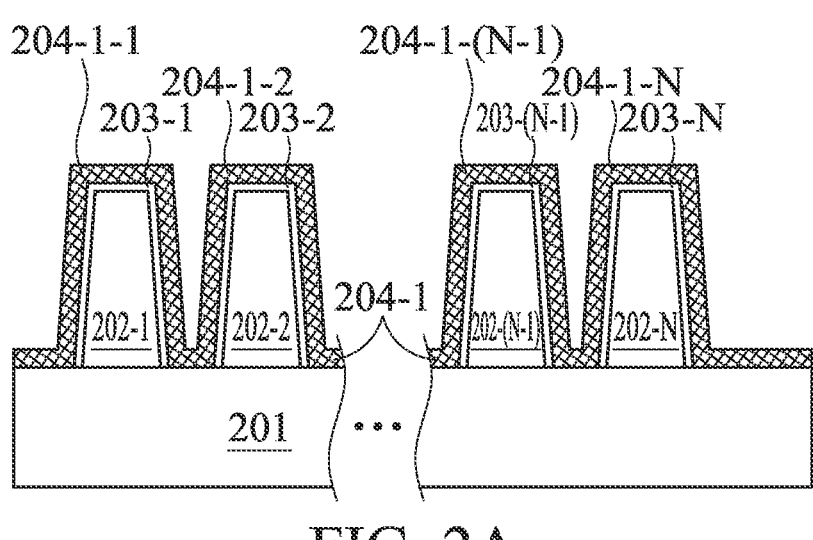
FIG. 2A-2J show a conventional method of varying work functions over different portions of a FinFET device.

FIG. 2A-J illustrates existing technologies for achieving multiple threshold voltages for a semiconductor device, such as a FinFET device. FIG. 2A shows semiconductor device 200 which has substrate 201. Substrate 201 has N fin structures, such as fin structures 202-1, 202-2, 202-(N−1) and 202-N. N may be 2, 3, 4, 5 etc. Each of the N fin structures has a respective gate dielectric layer over its top and side surfaces. For example, fin structure 202-1 has gate dielectric layer 203-1; fin structure 202-2 has gate dielectric layer 203-2; fin structure 202-(N−1) has gate dielectric layer 203-(N−1); fin structure 202-N has gate dielectric layer 203-N. Device 200 includes first work function layer 204-1 deposited over each N fin structures, including fin structures 202-1, 202-2, 202-(N−1) and 202-N. A respective content of each element of first work function layer 204-1 may be the same in each of its portions, including its portions 204-1-1, 204-1-2, 204-1-(N−1) and 204-1-N deposited respectively over fin structures 202-1, 202-2, 202-(N−1) and 202-N.

Figure 2B:
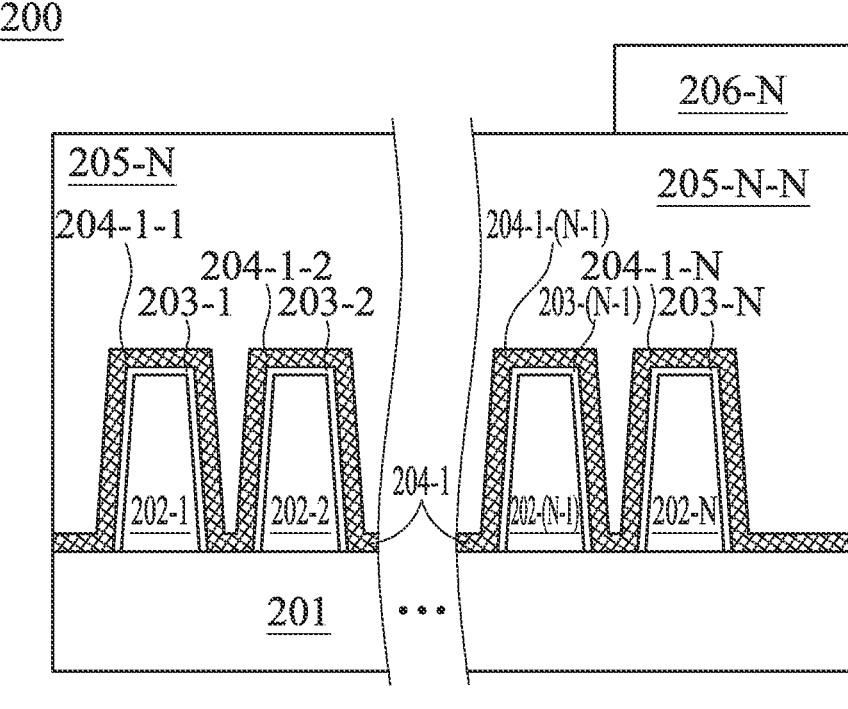

FIG. 2B shows device 200 with protective layer 205-N deposited on the top of first work function layer 204-1 over each N fin structures, including fin structures 202-1, 202-2, 202-(N−1) and 202-N. FIG. 2B shows mask layer 206-N, which may be for example, a photoresist layer deposited on the top of protective layer 205-N but only over fin structure 202-N. Portion 205-N-N of protective layer 205-N is a portion of protective layer 205-N masked by mask layer 206-N.

Figure 2C:
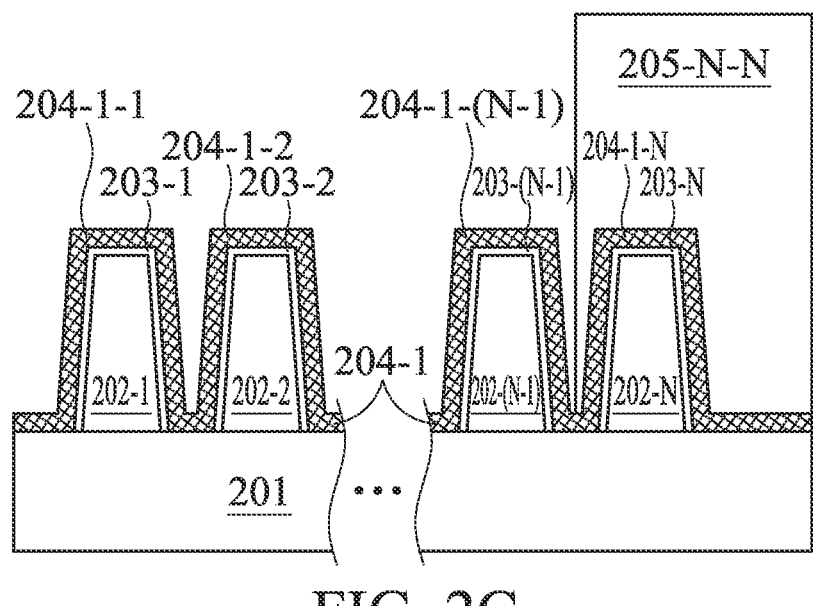

FIG. 2C shows device 200 after a portion of protective layer 205-N, which portion not covered by mask layer 206-N is removed together with mask layer 206-N itself, so that only protective layer portion 205-N-N remains over fin structure 202-N.

Figure 2D:
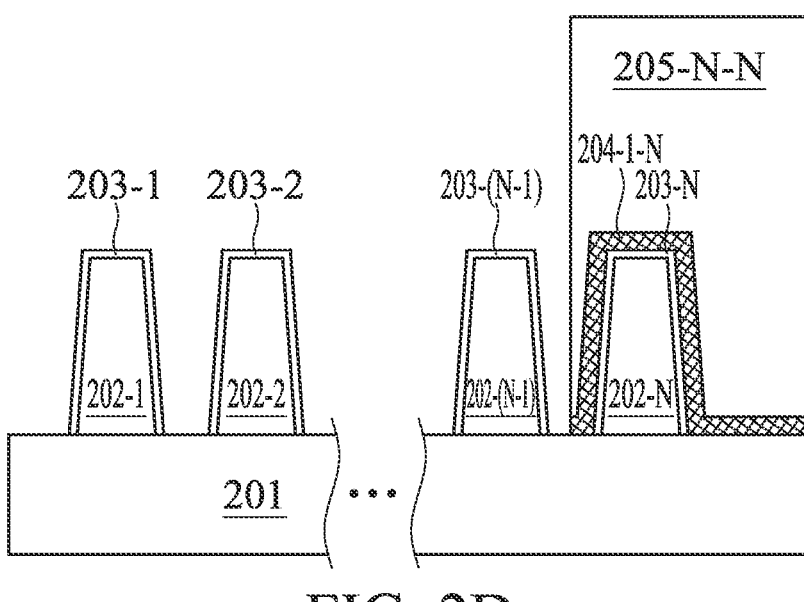

FIG. 2D shows device 200 with all the portions of first work function layer 204-1, other than those covered by protective layer portion 205-N-N, are etched away by, for example, dry etching or wet etching. In other words, FIG. 2D shows device 200 with portions 204-1-1, 204-1-2 and 204-1-(N−1) being etched away but with portion 204-1-N, which is covered by protective layer portion 205-N-N, remaining intact.

Figure 2E:
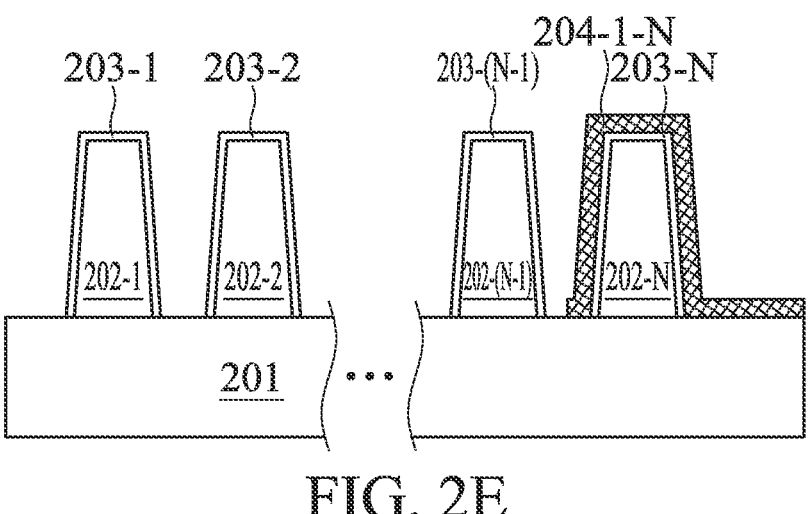

FIG. 2E shows device 200 after removal of protective layer portion 205-N-N. As in FIG. 2D, device 200 in FIG. 2E has only portion 204-1-N of first work function layer 204-1 remaining.

Figure 2F:
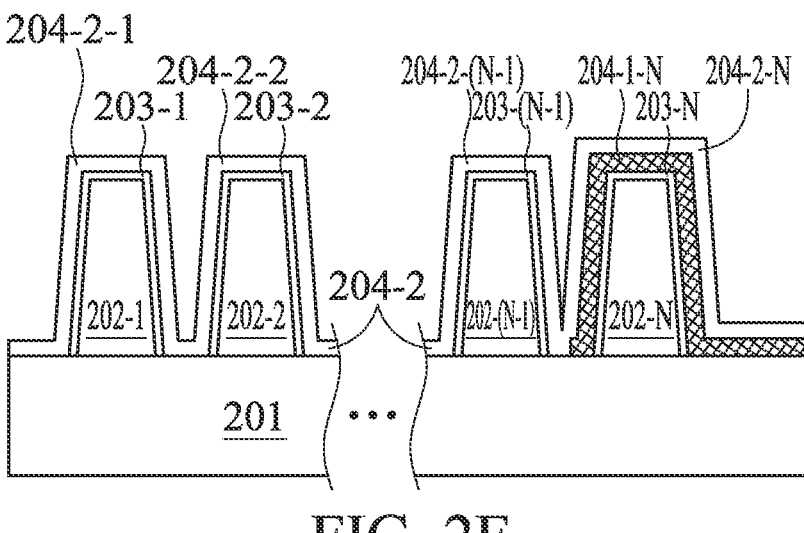

FIG. 2F shows device 200 after deposition of second work function layer 204-2. A content of each element of second work function layer 204-2 may be the same in each of its portions, including its portions 204-2-1, 204-2-2, 204-2-(N−1) and 204-2-N deposited respectively over fin structures 202-1, 202-2, 202-(N−1) and 202-N.

Second work function layer 204-2 may be patterned using the approach similar to the one used for patterning first work function layer 204-1. In other words, another protective layer may be deposited over each fin structure, including fin structures 202-1, 202-2, 202-(N−1) and 202-N, and another mask layer, which would define a portion of second work function layer 204-2, which would remain after etching, may be deposited over than protective layer. For example, FIG.

Figure 2G:
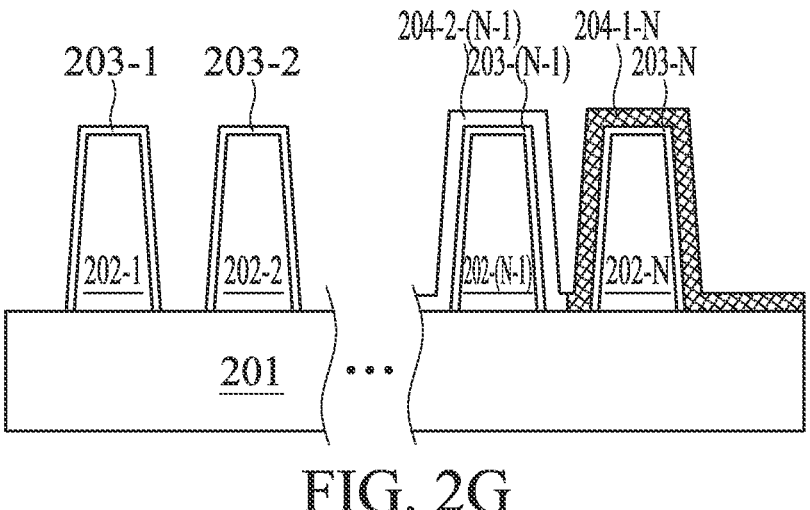

2G shows second work function layer 204-2 is patterned so that it remains intact only over fin structures 202-(N–1) and 202-N. In FIG. 2G, fin structure 202-N has portions of both first work function layer 204-1 and second work function layer 204-2 over it, while fin structure 202-(N–1) has only a portion of second work function layer 204-2 over it.

Depositions of subsequent work function layers with subsequent patterning may be repeated to provide different combinations of one or more work function layers over each fin. The different combinations of one or more work function layers over each fin structure provide the device with different threshold voltages.

Figure 2H:
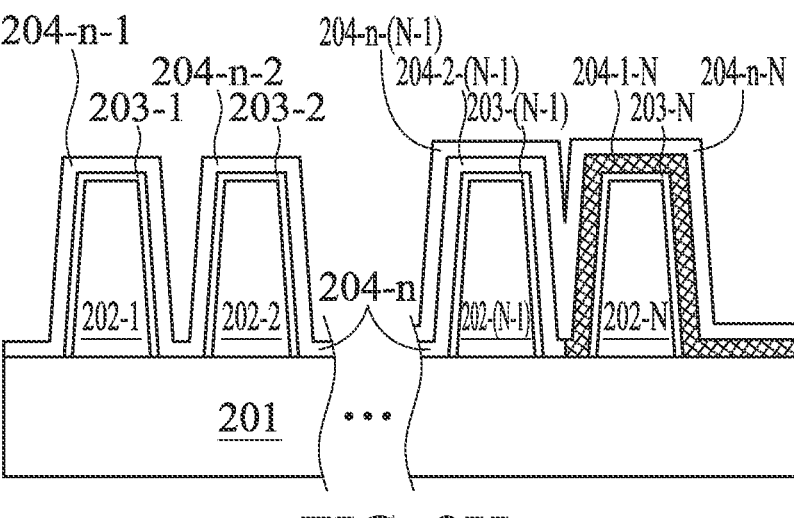
Figure 2I:
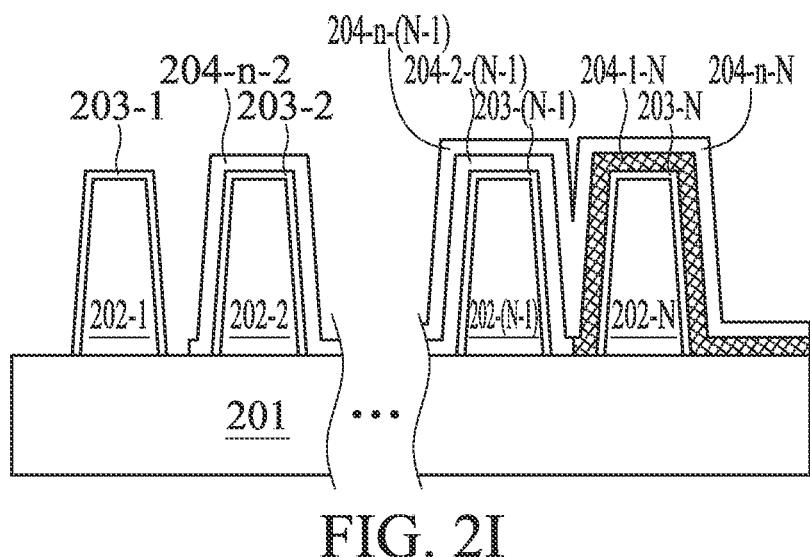

FIG. 2H shows deposition of nth work function layer 204-n, while FIG. 2I shows patterning nth work function layer 204-n so it is etched away from fin structure 202-1.

Figure 2J:
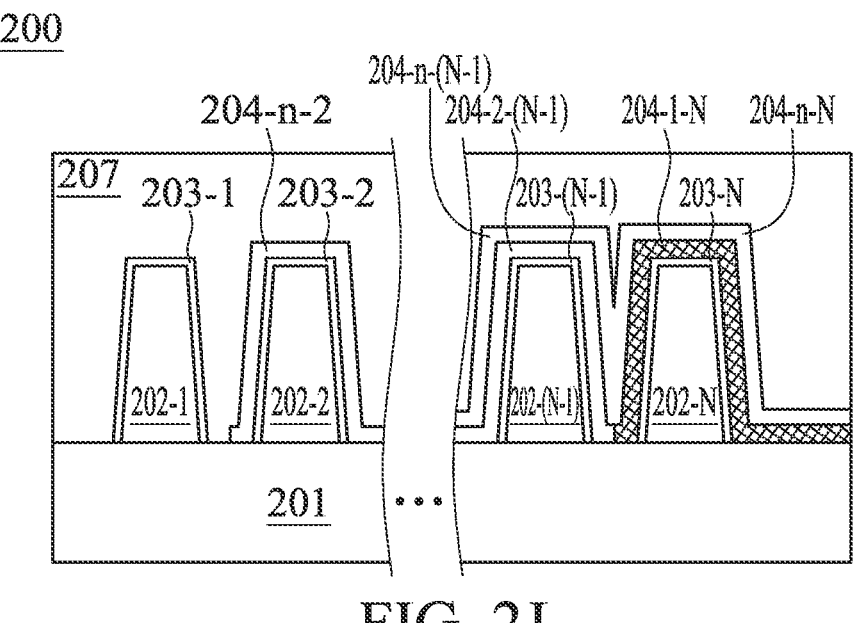

After forming the different combinations of one or more work function layers over each fin structure to provide the device with different threshold voltages a metal fill layer may be formed over each of the fin structures, including fin structures 202-1, 202-2, 202-(N–1) and 202-N. For example, FIG. 2J shows metal fill layer 207 formed over each of the fin structures, including fin structures 202-1, 202-2, 202-(N–1) and 202-N.

The existing technologies for achieving multiple threshold voltages for a semiconductor device, such as a FinFET device, such as the one illustrated in FIGS. 2A-J involves depositing multiple work function layers, such as layers 204-1, 204-2, 204-n, etc., may be costly. Also patterning of each of these multiple work function layers may be complicated and time-consuming.

FIG. 3A-3H illustrate production of a work function alloy layer of a semiconductor device, such as a FinFET device, so that the work function alloy layer has regions with a different content of an element of the alloy of the work function alloy. FIG. 3A shows semiconductor device 300 which has substrate 301. Substrate 301 has N fin structures, such as fin structures 302-1, 302-2, 302-(N–1) and 302-N. N may be 2, 3, 4, 5 etc. Each of the N fin structures has a respective gate dielectric layer over its top and side surfaces. For example, fin structure 302-1 has gate dielectric layer 303-1; fin structure 302-2 has gate dielectric layer 303-2; fin structure 302-(N–1) has gate dielectric layer 303-(N–1); fin structure 302-N has gate dielectric layer 303-N. Device 300 includes work function alloy layer 304 deposited over each N fin structures, including fin structures 302-1, 302-2, 302-(N–1) and 302-N. Work function alloy layer 304 follows the shapes of underlying fin structures, such as fin structures 302-1, 302-2, 302-(N–1) and 302-N, covering their side and top surfaces.

Work function alloy layer 304 is made of a metal alloy. The alloy of work function alloy contains an etchable element, which may be more susceptible or reactive to a particular type of wet etching, than other element(s) of that alloy.

In some embodiments, the alloy may be an aluminum containing alloy, i.e. an alloy containing aluminum as its etchable element, i.e. the element, which is more susceptible or reactive to a particular type of wet etching, than other element(s) of that alloy. One non-limiting example of the aluminum containing alloy may be an alloy that also contains one or more of Ti, N and C in addition to aluminum. In some embodiments, the aluminum-containing alloy may contain each of Ti, N, C and Al. In some embodiments, the aluminum-containing alloy may be made of or consist of Ti, N, C and Al, i.e. be a $Ti_xAl_yN_zC_a$ alloy. A content of aluminum in an initially deposited aluminum containing alloy may vary. For example, an atomic percentage of aluminum in the aluminum containing alloy may be from 3 at % to 70% or from 5 at % to 50 at % or from 30 at % to 50 at % or any value or subrange within these ranges.

In some embodiments, the alloy may be a tungsten containing alloy, i.e. an alloy that contains tungsten as its etchable element, i.e. the element, which is more susceptible or reactive to a particular type of wet etching, than other element(s) of that alloy. One non-limiting example of the tungsten containing alloy may be an alloy that also contains one or more of N and C in addition to tungsten. In some embodiments, the tungsten containing alloy may contain each of N, C and W. In some embodiments, the tungsten-containing alloy may be made of or consist of N, C and W, i.e. be a $W_yN_zC_a$ alloy.

Work function alloy layer 304 may be deposited by a physical or a chemical deposition technique. In some embodiments, work function alloy layer 304 may be deposited by one of physical vapor deposition, sputtering or atomic layer deposition. Although a thickness of deposited work function alloy layer 304 may not be limited, in some embodiments, such thickness may be, for example, from 3 Å to 200 Å or from 5 Å to 150 Å or from 5 Å to 100 Å.

A respective content of each element of work function alloy layer 304 after its deposition may be the same in each of its portions, including its portions 304-1, 304-2, 304-(N–1) and 304-N deposited respectively over fin structures 302-1, 302-2, 302-(N–1) and 302-N. For example, when the alloy of work function alloy layer 304 is an aluminum containing alloy, a respective content of each element of such alloy, including aluminum, is the same in each portion of work function alloy layer 304, including its portions 304-1, 304-2, 304-(N–1) and 304-N. For example, for the aluminum-containing alloy that consists of Ti, N, C and Al, a content of Ti in the same in each portion of work function alloy layer 304, a content of Al is the same in each portion of work function alloy layer 304, a content of C in each portion of work function alloy layer 304 and a content of N is in each portion of work function alloy layer 304.

Multiple threshold voltages may be achieved in device 300 through wet etching of different portions of work function alloy layer 304 to achieve a different content of the etchable element of the alloy in each portion of work function alloy layer through varying wet etching conditions, such as a time of the wet etching, a concentration of the wet etching solution and/or a temperature of the wet etching, without changing or substantially changing a content of each of the remaining element(s) of the alloy. After the initial deposition of work function alloy layer 304, the process may involve no other work function layer depositions and/or no other metal layer deposition.

FIG. 3B shows protective material 305-1 over work function alloy layer 304 over each of N fin structures, including fin structures 302-1, 302-2, 302-(N–1) and 302-N. Protective material 305-1 fills spaces between adjacent pairs of fins, such as 302-1 and 302-2, (302-N–1) and 302-N. Protective material 305-1 has a continuous portion over the top of each of N fin structures, including fin structures 302-1, 302-2, 302-(N–1) and 302-N. As such protective material 305-1 covers and protects work function alloy layer 304 on side and top surfaces of each N fin structures, including fin structures 302-1, 302-2, 302-(N–1) and 302-N. Protective material 305-1 has a substantially plain or flat upper surface.

FIG. 3B also shows mask layer 306-1 deposited on a portion of the upper surface of protective material 305-1. Mask layer 306-1 does not cover all of the upper surface of protective material 305-1. Instead it leaves a portion of protective material 305-1, such as portion 305-1-N in FIG.

3B, exposed. The exposed portion of protective material 305-1, such as portion 305-1-N, defines a portion of work function alloy layer 304, which will be exposed to a subsequent wet etching. In FIG. 3B exposed portion 305-1-N is over portion 304-N of work function alloy layer 304 over fin structure 302-N. The exposed portion of protective layer 305-1 can cover more than a single fin structure. Also a border of the exposed portion of protective layer 305-1 defined by the border of mask layer 306-1 may be or may be not in an area between two fin structures. For example, in the latter case, the border of the exposed portion of protective layer 305-1 defined by the border of mask layer 306-1 may be over one of the fin structures.

Protective material 305-1 is made of a material, which is resistant to a particular type of wet etching, which will be performed on a portion of work function alloy layer 304. For example, when the alloy of work function alloy layer 304 is an aluminum containing alloy, for wet etching aluminum from such alloy, a base or a basic solution, such as an aqueous solution of a base, may be used. Non-limiting examples of bases include $NH_4OH$, $NaOH$, $KOH$, $Ca(OH)_2$, $Na_2CO_3$. In such a case, protective material 305-1 is made of a material, which is resistant to the base or the basic solution.

In some embodiments, a concentration of a base, such as $NH_4OH$, in an aqueous basic etching solution may be from 0.01 vol % to 30 vol % or from 0.05 vol % to 28 vol % or from 0.1 vol % to 28 vol % or from 0.1 vol % to 25 vol % or any value or subrange within those ranges. Etching times with a basic solution may be from 5 sec to 1200 sec or from 10 sec to 1000 sec or from 10 sec to 900 sec or any value or subrange within those ranges. A temperature of etching with a basic solution may be from 15 C to 90 C or from 20 C to 85 C or from 25 C to 80C or any value or subrange within these ranges.

When the alloy of work function alloy layer 304 is an tungsten containing alloy, selective wet etching of tungsten from such alloy may be performed using an oxidizer or an oxidizing solution, such as an aqueous solution containing an oxidizer. Non-limiting examples of oxidizers include $H_2O_2$ and other inorganic peroxides. In such a case, protective material 305-1 is made of a material, which is resistant to the oxidizer or the oxidizing solution.

In some embodiments, a concentration of an oxidizer, such as $H_2O_2$, in an aqueous oxidizingetching solution may be from 0.1 vol % to 70 vol % or from 0.5 vol % to 60 vol % or from 1 vol % to 50 vol % or any value or subrange within those ranges. Etching times with an oxidizing solution may be from 5 sec to 1200 sec or from 10 sec to 1000 sec or from 10 sec to 900 sec or any value or subrange within those ranges. A temperature of etching with an oxidizing solution may be from 15 C to 90 C or from 20 C to 85 C or from 25 C to 80C or any value or subrange within these ranges.

Materials for protective material 305-1 may include bottom anti-reflective coating BARC materials, which are used for forming a (BARC). Materials for mask layer 306-1 may include a photoresist. In some embodiments, BARC material as protective material 305-1 may be deposited by a coating technique such as spin coating, over each of N fin structures, including fin structures 302-1, 302-2, 302-(N−1) and 302-N. A thickness of the BARC material may be from 100 to 2000 Å or from 200 to 2000 Å Following the deposition of the BARC material, it may be subjected to one or more baking processes.

The photoresist may be deposited on the upper surface of the BARC material by a coating technique, such as spin coating. A thickness of the photoresist may be from 500 Å to 1 μm or from 1000 Å to 1 μm. The photoresist may be patterned to define an exposed portion of the BARC material, such as portion 305-N−1 using for example, a photolithographic process, such as high resolution deep UV photolithographic process.

The BARC material may provide for absorption of radiation incident to the substrate during photolithography processes, including exposure of an overlying photoresist layer (as described below). In some embodiments, the BARC is a developer-soluble ARC (e.g., DBARC). The developer-soluble coating has a composition that is soluble in a developer solution, for example, the developer used to develop an overlying photoresist layer. In an embodiment, the BARC is a photosensitive BARC, also known as photoimageable BARC. A photosensitive BARC, or photoimageable BARC, is a composition that changes solubility to a developer solution upon exposure to radiation. In one type of photosensitive BARC, the material becomes soluble in developer upon irradiation (e.g., similar to positive tone resist). In another type of photosensitive BARC, the material becomes insoluble in developer upon irradiation (e.g., similar to negative tone resist).

The photosensitive BARC may include a photoacid generator (PAG). The photosensitive BARC, or photoimageable BARC, is a composition that changes solubility to a developer solution upon exposure to radiation.

The photosensitive BARC may include a composition such as an acid sensitive functional group. The acid sensitive functional group can become developer-soluble after reaction with an acid. The acid in the BARC may come from the photo acid that is generated after exposure to a radiation beam. For example, in an embodiment the photo acid is PAG (photo acid generator). The PAG may be sensitive to KrF, ArF, EUV, Ebeam, and/or other suitable radiation.

The DBARC may include a functional group that has a polarity group, which can increase the polymer solubility when contacted with a developer such as TMAH. For example, the polymer polarity group may contain a hydroxyl group, lactone, carboxylic, epoxy and/or other suitable component. The DBARC polymer may selected from polyhydroxystyrene (PHS), methacrylate, acrylate, naphthalene, and/or other suitable structure that can meet the desired etch and reflectivity requirement. The BARC may also contain cross linker for solvent resistance achievement. For example, the cross linker may contain hydroxyl group for cross linking reaction. The cross linker may be composed of trialkyl amine. For example, it may include triethylamine.

BARC compositions typically used in semiconductor processing, including commercially available ones, may be used as the BARC material.

The photoresist may be chemical amplified photoresist (CAR). The photoresist may include a polymer, a photoacid generator (PAG), which provides the solubility change to the developer, a solvent, and/or other suitable compositions. The photoresist may be formed by processes such as coating (e.g., spin-on coating) and soft baking.

FIG. 3C shows device 300 following etching ("BARC etching") portion 305-1-N of protective materials 305-1, which was not covered by mask layer 306-1. The BARC etching may accomplished, for example, using etchant gases, which may include one or more fluorocarbon etchant gases having the general formula of $C_xF_y$, with subscripts x and y in $C_xF_y$ ranging from 0 to 9; and $C_xH_yF_z$, with subscripts x, y, and z ranging from 0 to 9. Examples of such gases comprise $CF_4$, $C_2F_6$, $C_4F_8$, $CHF_3$, $CH_2F_2$ or $CH_3F$ or combinations thereof. The photoresist of mask layer 306-1 may erode during the etching and be removed.

As the result of the etching, portion 304-N of work function alloy layer 304 becomes exposed, while the remaining portion of work function alloy layer 304, including portions 304-1, 304-2 and 304-(N−1) is covered by a portion of protective material 305-1, which was not removed by the etching.

Exposed portion 304-N of work function alloy layer 304 is then contacted by an etching solution to reduce a content of the etchable element in the exposed portion. Contents of the etchable element in the remaining portion of work function alloy layer 304 (including portions 304-1, 304-2 and 304-(N−1)), which is still covered by protective material 305-1 remains unchanged.

Following the wet etching the remaining portion of protective material 305-1 may be removed by, for example, ashing, which may be, for instance, plasma ashing. Exemplary ashing conditions may involve a combination of $N_2/H_2/O_2$, with a concentration of each gas being from 0 to 10000 ccm or 1 to 10000 ccm or 10 to 10000 ccm.

FIG. 3E shows device 300 after the remaining portion of protective material 305-1 is removed or ashed away. In FIG. 3E, the content of the etchable element in section 304-N is reduced compared to the content of the etchable element in the rest of work function alloy layer 304.

For wet etching a second portion of work function alloy layer 304, a second protective material, which may be a BARC material, may be formed over all of work function alloy layer 304 over all N fin structures. The second protective fills spaces between adjacent pairs of fins. The second protective material has a continuous portion over the top of each of N fin structures. The second protective material has a substantially plain or flat upper surface. Then a second mask layer, which may be a photoresist layer, may be formed on the top of the second protective material. The portion of the second protective layer not covered by the second mask layer will define the second portion of working of work function alloy layer, which will be exposed to the wet etching after the portion of the second protective layer not covered by the second mask layer is etched away. The disclosure for protective material 305-1 is generally applicable for the second protective material, while the disclosure for mask layer 306-1 is generally applicable for the second mask layer, with the only difference being that the exposed portion of the second protective material, i.e. the portion of the second protective material not covered by the second mask layer, is different from the exposed portion of protective material 305-1. As such the first portion of work function alloy layer 304 defined by the exposed portion of protective material 305-1 is different and does not overlap or does not substantially overlap with the second portion of work function alloy layer 304 defined by the exposed portion of the second protective material.

Conditions, such as a time of the wet etching, an etchant concentration of the wet etching solution and/or a temperature of the wet etching, for the wet etching the second portion of work function alloy layer are different from the conditions for wet etching portion 304-N of work function alloy layer 304. As the result, a content of the etchable element in the second portion of work function alloy layer 304 will be different from the content of the etchable element in portion 304-N. For example, a longer time of wet etching will lead to a lower content of the etchable element. A higher etchant concentration will also lead to a lower content of the etchable element. A higher etching temperature will again lead to a lower content of the etchable element.

Following the wet etching of the second portion of work function alloy layer 304 the remaining portion of the second protective material may be removed or ashed away. FIG. 3F shows device 300 after portion 304-(N−1) (which illustrates the second portion) of work function alloy layer 304 is wet etched to reduce a content of the etchable element in it and the second protective material is removed or ashed away. In FIG. 3F, portion 304-N of work function alloy layer 304 has a first reduced content of the etchable element, portion 304-(N−1) has a second reduced content of the etchable element, which is different from the first reduced content. The remaining portion of work function alloy layer 304, including portions 304-1 and 304-2, has the original, unreduced content of the etchable element, which is different from the first reduced content and the second reduced content.

Operations of wet etching a particular portion of work function alloy layer 304 may be performed one or more additional times. In each case, the particular portion of work function alloy layer 304 will be defined by an area of a protective material, such as a BARC material, initially deposited over all of work function alloy layer 304 over all N fin structures, which area is not covered by a mask layer, such as a photoresist layer, on the top of the protective material. Wet etching of each distinct portion of work function alloy layer 304 may provide it with a reduced content of the etchable element, which is different from a content of the etchable element in any other portion of work function alloy layer.

FIG. 3G illustrates device 300 after wet etchings are performed on multiple portions of work function alloy layer 304 so that each of the multiple portions has a distinct content of the etchable element in it due to distinct wet etching conditions used for the particular portion of work function alloy layer 304. The distinct of the etchable element in each of the multiple portions of work function alloy layer 304 will provide each of the multiple portions with a distinct threshold voltage. Specifically, FIG. 3G shows portions 304-1, 304-2 and 304-(N−1) and 304-N each having a distinct content of the etchable element due to distinct wet etching conditions used for etching each of these portions. Because of the distinct content of the etchable element, each of portions 304-1, 304-2 and 304-(N−1) and 304-N has a distinct threshold voltage. Device 300 in FIG. 3G is essentially the same as device 100 in FIG. 1.

Figure 3H:
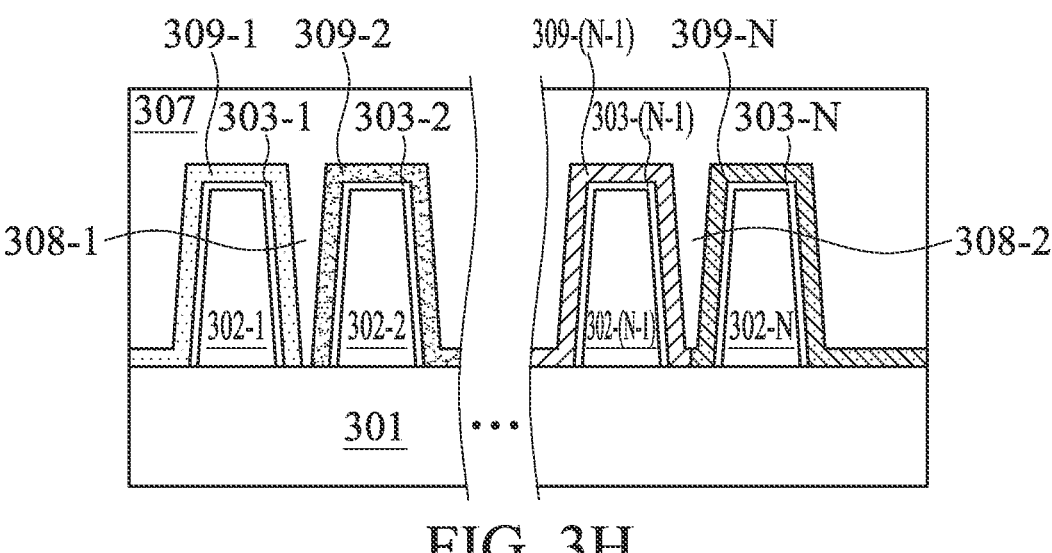

After forming working function metal layer 304 with multiple portions, each having a distinct threshold voltage due to a distinct content of the etchable element in the portion, a metal fill layer may be formed over working function metal layer 304 over each of the fin structures, including fin structures 302-1, 302-2, 302-(N−1) and 302-N. For example, FIG. 3H shows metal fill 307 formed over each of the fin structures, including fin structures 302-1, 302-2, 302-(N−1) and 302-N.

Metal fill 307 can fill trenches or space between adjacent pairs of individual fin structures, such as fin structures 302-1, 302-2, 302-(N−1) and 302-N. For example, metal fill 307 may fill trench 308-1 between fin structures 302-1 and 302-2 and trench 308-2 between fin-structures 302-(N−1) and 302-N. Metal fill 307 may become together with a portion of work function alloy layer 304 and an underlying dielectric layer may form an active gate structure for each of the fin structures, where the active gate structure straddles the fin structure. For example, for fin structure 302-1, its active gate structure 309-1 includes metal fill 307, portion 304-1 of work function alloy layer 304 as well as its gate dielectric layer 303-1 straddling over fin 302-1; for fin structure 302-2, its active gate structure 309-2 includes metal fill 307, portion 304-2 of work function alloy layer 304 as well as its gate dielectric layer 303-2 straddling over fin 302-2; for fin structure 302-(N−1), its active gate structure 309-(N−1) includes metal fill 307, portion 304-(N−1) of work function alloy layer 304 as well as its gate dielectric layer 303-(N−1) straddling over fin 302-(N−1); for fin structure 302-N, its active gate structure 309-N includes metal fill 307, portion 304-N of work function alloy layer 304 as well as its gate dielectric layer 303-N straddling over fin 302-N.

Metal fill 307 may include a suitable metal, such as tungsten (W), formed by a suitable method, such as PVD, CVD, electroplating, electroless plating, or the like. Besides tungsten, other suitable material, such as copper (Cu), gold (Au), cobalt (Co), combinations thereof, multilayers thereof, alloys thereof, or the like, may also be used as metal fill 307.

Figure 5:
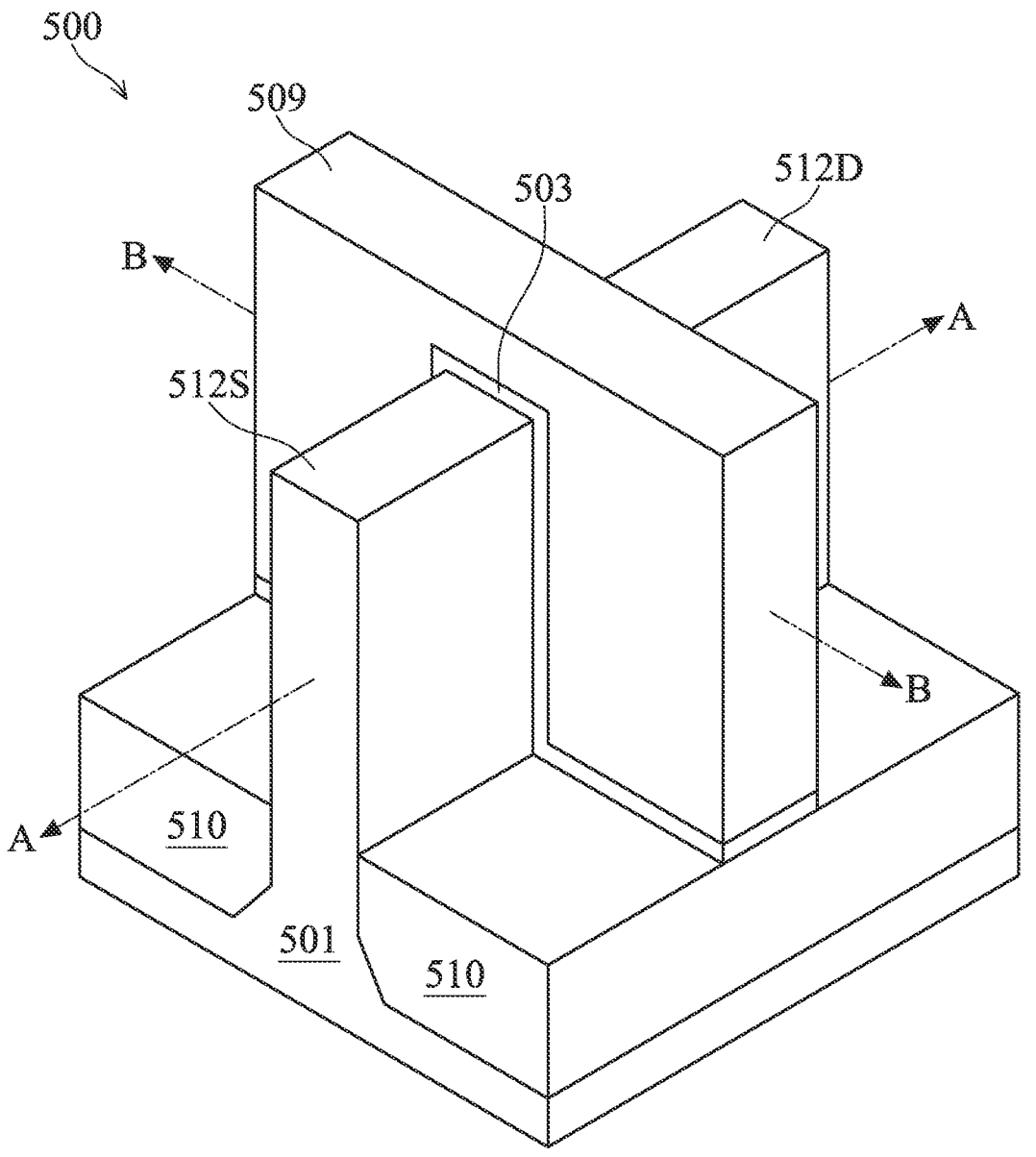
FIG. 5 illustrates a perspective view of a Fin Field-Effect Transistor (FinFET) device, in accordance with some embodiments.

FIG. 5 illustrates a perspective view of an example FinFET device 500. The FinFET device 500 includes a substrate 501 and a fin 502 protruding above the substrate 501. Isolation regions 510 are formed on opposing sides of the fin 502, with the fin 502 protruding above the isolation regions 510. A gate dielectric 503 is along sidewalls and over a top surface of the fin 502, and a gate 509 is over the gate dielectric 503. Source/drain structures 512S and 512D are in (or extended from) the fin 502 and on opposing sides of the gate dielectric 503 and the gate 509. FIG. 5 is provided as a reference to illustrate a number of cross-sections in subsequent figures. For example, cross-section B-B extends along a longitudinal axis of the gate 509 of the FinFET device 500. Cross-section A-A is perpendicular to cross-section B-B and is along a longitudinal axis of the fin 502 and in a direction of, for example, a current flow between the source/drain structures 512S/D. FIG. 6A-6F refer to these reference cross-sections.

FIG. 6A-6F each illustrate, in a cross-sectional view, a portion of a FinFET device 600 at various fabrication stages of the process 400, such as those corresponding to operations 402, 404, 406 and 408. The FinFET device 600 is substantially similar to the FinFET device 500 shown in FIG. 5. Although FIG. 6A-6F illustrate the FinFET device 300, it is understood the FinFET device 600 may include a number of other devices such as inductors, fuses, capacitors, coils, etc., which are not shown in FIG. 6A-6F for purposes of clarity of illustration.

Figure 6A:
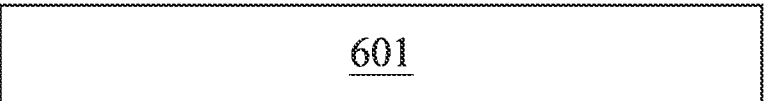
FIG. 6A-6F illustrate cross-sectional views of an example FinFET device (or a portion of the example FinFET device) during various fabrication stages, made by the method of FIG. 4, in accordance with some embodiments.

Corresponding to operation 402 of FIG. 4, FIG. 6A is a cross-sectional view of the FinFET device 600 including a semiconductor substrate 601 at one of the various stages of fabrication. The cross-sectional view of FIG. 6A is cut along the lengthwise direction of a dummy or an active gate structure (e.g., cross-section B-B, as indicated in FIG. 5).

The substrate 601 may be a semiconductor substrate, such as a bulk semiconductor, a semiconductor-on-insulator (SOI) substrate, or the like, which may be doped (e.g., with a p-type or an n-type dopant) or undoped. The substrate 601 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 601 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 6B:
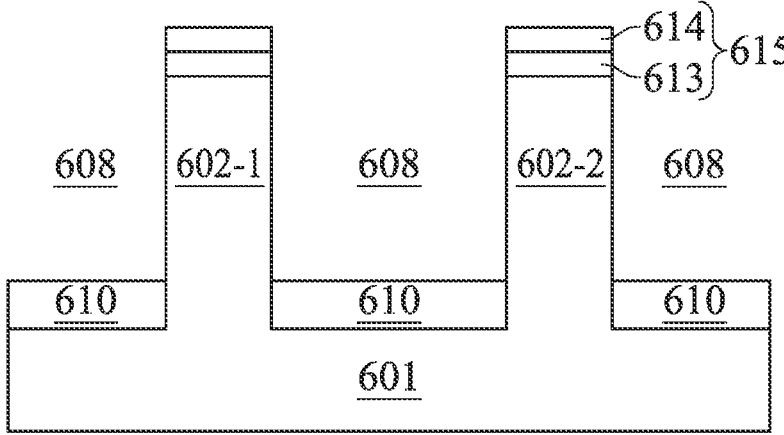

Corresponding to operation 404 of FIG. 4, FIG. 6B is a cross-sectional view of the FinFET device 600 including (semiconductor) fin structures 602-1 and 602-2 at one of the various stages of fabrication. The cross-sectional view of FIG. 6B is cut along the lengthwise direction of a dummy or an active gate structure (e.g., cross-section B-B, as indicated in FIG. 5).

Although two fin structures are shown in the illustrated embodiment of FIG. 6B (and subsequent FIGS. 6C-6F), it should be appreciated that the FinFET device 600 can include any number of fin structures while remaining within the scope of the present disclosure. In some embodiments, the fin structures 602-1 and 602-2 are formed by patterning the substrate 601 using, for example, photolithography and etching techniques. For example, a mask layer, such as a pad oxide layer 613 and an overlying pad nitride layer 614, is formed over the substrate 601. The pad oxide layer 613 may be a thin film comprising silicon oxide formed, for example, using a thermal oxidation process. The pad oxide layer 613 may act as an adhesion layer between the substrate 601 and the overlying pad nitride layer 614. In some embodiments, the pad nitride layer 614 is formed of silicon nitride, silicon oxynitride, silicon carbonitride, the like, or combinations thereof. The pad nitride layer 614 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 613 and pad nitride layer 614 to form a patterned mask 615, as illustrated in FIG. 6B.

The patterned mask 615 is subsequently used to pattern exposed portions of the substrate 601 to form trenches (or openings) 608, thereby defining a fin structure (e.g., 602-1, 602-2) between adjacent trenches 608 as illustrated in FIG. 6B. When multiple fin structures are formed, such a trench may be disposed between any adjacent ones of the fin structures. In some embodiments, the fin structures 602-1 and 602-2 are formed by etching trenches in the substrate 601 using, for example, reactive ion etch (RIE), neutral beam etch (NBE), the like, or combinations thereof. The etch may be anisotropic. In some embodiments, the trenches 608 may be strips (viewed from the top) parallel to each other, and closely spaced with respect to each other. In some embodiments, the trenches 608 may be continuous and surround each of the fin structures 602-1 and 602-2. The fin structures 602-1 and 602-2 may sometimes be referred to as fin 602 hereinafter.

The fin 602 may be patterned by any suitable method. For example, the fin 602 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

Each fin 602 may have a width, i.e. a dimension parallel B-B direction, from 1 nm to 100 nm or from 2 nm to 70 nm or from 2 nm to 50 nm or from 10 nm to 50 nm or from 2 nm to 10 nm. Each fin 602 may have a height, i.e. a distance on which it protrudes from the substrate 601, from 10 nm to 200 nm or from 15 nm to 150 nm or from 20 nm to 100 nm.

In certain embodiments, device 600 may include multiple types of fins 602, with fin(s) within each type having at least one dimension, such as a height and/or a width, being different from fin(s) of any other type. For example, in some embodiments, device 600 may include (a) smaller fin(s), each having a fin width from 2 nm to 10 nm and a fin height from 20 nm to 100 nm, and (b) larger fin(s), each having a fin width from 10 nm to 50 nm and a fin height from 20 nm to 100 nm.

Figure 6C:
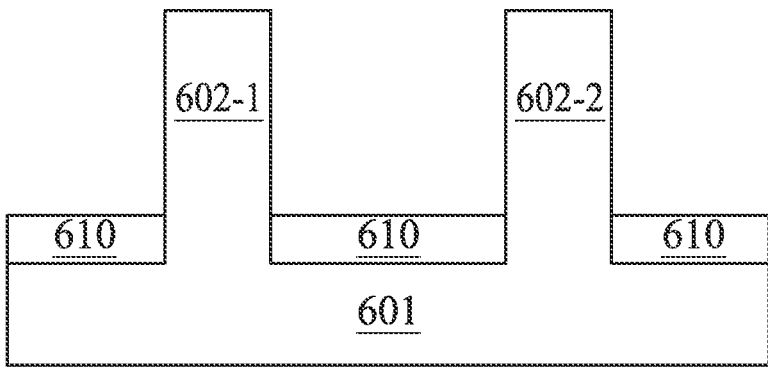

Corresponding to operation 406 of FIG. 4, FIG. 6C is a cross-sectional view of the FinFET device 600 including isolation regions 610 at one of the various stages of fabrication. The cross-sectional view of FIG. 6C is cut along the lengthwise direction of a dummy or an active gate structure (e.g., cross-section B-B, as indicated in FIG. 5).

The isolation regions 610, which are formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 610 and a top surface of the fin 602 that are coplanar (not shown). The patterned mask 615 (FIG. 6B) may also be removed by the planarization process.

In some embodiments, the isolation regions 610 include a liner, e.g., a liner oxide (not shown), at the interface between each of the isolation regions 610 and the substrate 601 (fin 602). In some embodiments, the liner oxide is formed to reduce crystalline defects at the interface between the substrate 601 and the isolation region 610. Similarly, the liner oxide may also be used to reduce crystalline defects at the interface between the fin 602 and the isolation region 610. The liner oxide (e.g., silicon oxide) may be a thermal oxide formed through a thermal oxidation of a surface layer of the substrate 601, although other suitable method may also be used to form the liner oxide.

Next, the isolation regions 610 are recessed to form shallow trench isolation (STI) regions 610, as shown in FIG. 6C. The isolation regions 610 are recessed such that the upper portions of the fin 602 protrude from between neighboring STI regions 610. Respective top surfaces of the STI regions 610 may have a flat surface (as illustrated), a convex surface, a concave surface (such as dishing), or combinations thereof. The top surfaces of the STI regions 610 may be formed flat, convex, and/or concave by an appropriate etch. The isolation regions 610 may be recessed using an acceptable etching process, such as one that is selective to the material of the isolation regions 610. For example, a dry etch or a wet etch using dilute hydrofluoric (DHF) acid may be performed to recess the isolation regions 610.

FIG. 6A-6C illustrate an embodiment of forming the fin 602, but a fin may be formed in various different processes. For example, a top portion of the substrate 601 may be replaced by a suitable material, such as an epitaxial material suitable for an intended type (e.g., N-type or P-type) of semiconductor devices to be formed. Thereafter, the substrate 601, with epitaxial material on top, is patterned to form the fin 602 that includes the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fin 602 may include silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6D:
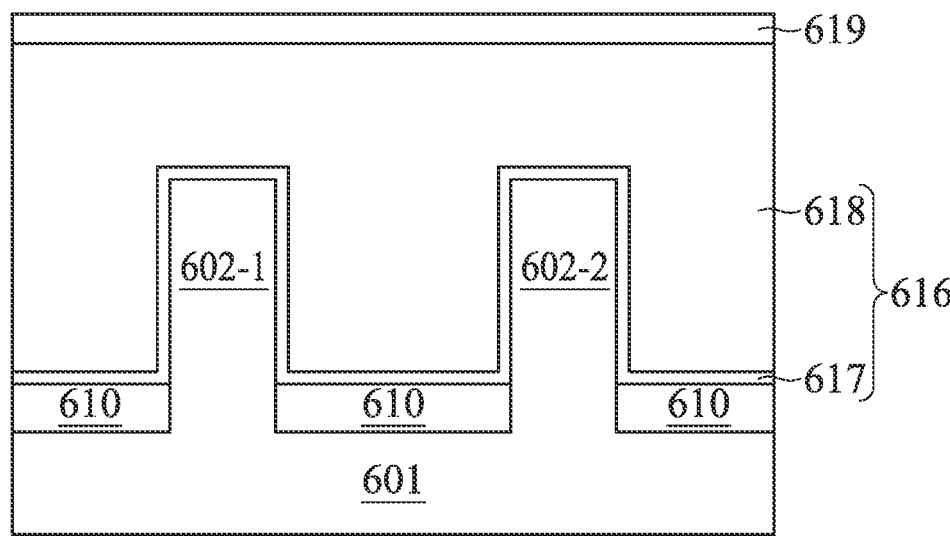

FIG. 6D is a cross-sectional view of the FinFET device 600 including a dummy gate structure 616 at one of the various stages of fabrication. The cross-sectional view of FIG. 6D is cut along the lengthwise direction of a dummy or an active gate structure (e.g., cross-section B-B, as indicated in FIG. 5).

The dummy gate structure 616 includes a dummy gate dielectric 617 and a dummy gate 618, in some embodiments. A mask 619 may be formed over the dummy gate structure 616. To form the dummy gate structure 616, a dielectric layer is formed on the fin 602. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form the mask 619. The pattern of the mask 619 then may be transferred to the gate layer and the dielectric layer by an acceptable etching technique to form the dummy gate 618 and the underlying dummy gate dielectric 617, respectively. The dummy gate 618 and the dummy gate dielectric 617 cover a central portion (e.g., a channel region) of the fin 602. The dummy gate 618 may also have a lengthwise direction (e.g., direction B-B of FIG. 5) substantially perpendicular to a lengthwise direction (e.g., direction of A-A of FIG. 5) of the fin 602.

The dummy gate dielectric 617 is shown to be formed over the fin 602 (e.g., over top surfaces and sidewalls of each fin structures 602-1 and 602-2) and over the STI regions 610 in the example of FIG. 6D. In other embodiments, the dummy gate dielectric 617 may be formed by, e.g., thermal oxidization of a material of the fin 602, and therefore, may be formed over the fin 602 but not over the STI regions 610. It should be appreciated that these and other variations are still included within the scope of the present disclosure.

An example gate-last process (sometimes referred to as replacement gate process) is performed subsequently to replace the dummy gate structures 616 with an active gate structure (which may also be referred to as a replacement gate structure or a metal gate structure). Prior to removing the dummy gate structure 616, a number of features/structures may have been formed in the FinFET device 600. For example, a gate spacer disposed on sides of the dummy gate structure 616, source/drain structures formed in the fin 602 (e.g., on the sides of the dummy gate structure 600 with the gate spacer disposed therebetween), an interlayer dielectric (ILD) disposed over the source/drain structures, etc.

Figure 6E:
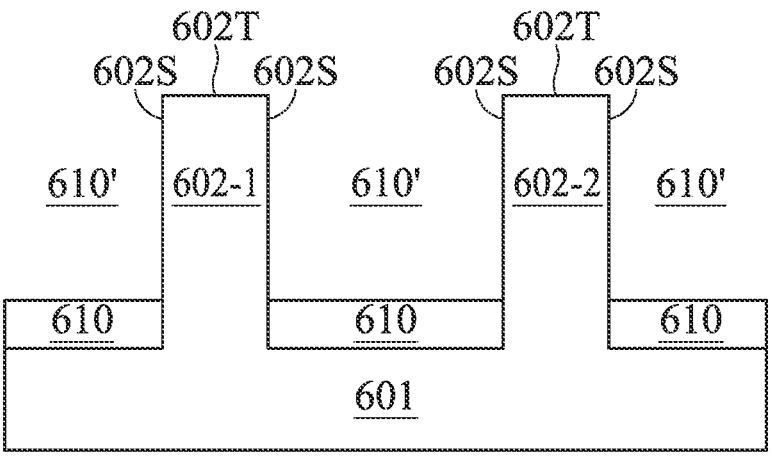

FIG. 6E is a cross-sectional view of the FinFET device 600 in which the dummy gate structure 616 is removed to form a gate trench 610', at one of the various stages of fabrication. The cross-sectional view of FIG. 6E is cut along the lengthwise direction of a dummy or an active gate structure (e.g., cross-section B-B, as indicated in FIG. 5).

To remove the dummy gate structure 616, one or more etching steps are performed to remove the dummy gate 618 and then the dummy gate dielectric 617, so that the gate trench 610' (which may also be referred to as a recess) is formed. The gate trench 610' can expose a channel region of the fin structure 602. During the dummy gate removal, the dummy gate dielectric 617 may be used as an etch stop layer when the dummy gate 618 is etched. The dummy gate dielectric 617 may then be removed after the removal of the dummy gate 618. Upon removing the dummy gate structure 616 (or forming the gate trench 610'), a top surface 602T and sidewalls 602S of each of the fin structures 602 can be exposed, which can be better illustrated in the cross-sectional view of FIG. 6E.

Figure 6F:
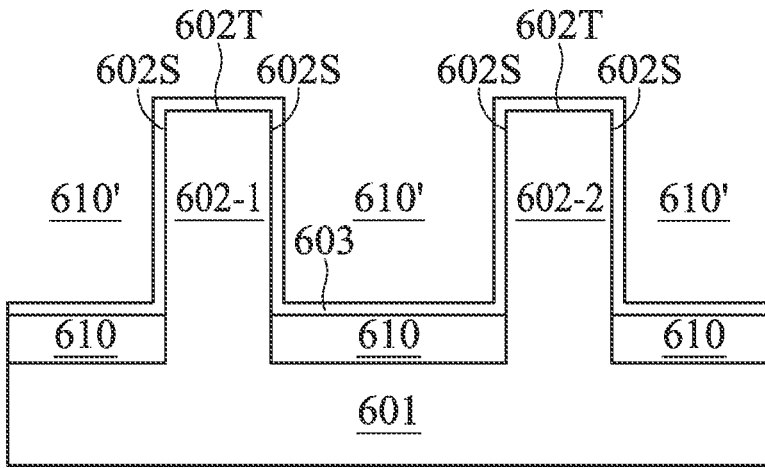

Corresponding to operation 408 of FIG. 4, FIG. 6F is a cross-sectional view of the FinFET device 600 including a gate dielectric layer 603, at one of the various stages of fabrication. The cross-sectional view of FIG. 6F is cut along the lengthwise direction of a dummy or an active gate structure (e.g., cross-section B-B, as indicated in FIG. 5).

The gate dielectric layer 603 is disposed, such as on the top surface and along the sidewalls of each fin structure 602-1 and 602-2. In some embodiments, the gate dielectric layer 603 may include silicon oxide, silicon nitride, or multilayers thereof. In example embodiments, the gate dielectric layer 603 includes a high-k dielectric material, and in these embodiments, the gate dielectric layer 603 may have a k value greater than about 7.0, and may include a metal oxide or a silicate of Hf, Al, Zr, La, Mg, Ba, Ti, Pb, and combinations thereof. The formation methods of gate dielectric layer 603 may include molecular beam deposition (MBD), atomic layer deposition (ALD), PECVD, and the like. A thickness of the gate dielectric layer 603 may be between about 8 angstroms (Å) and about 20 angstroms, as an example. A thickness of the gate dielectric layer 603 may be between about 5 nanometer (nm) and about 25 nm, as another example.

Figure 7A:
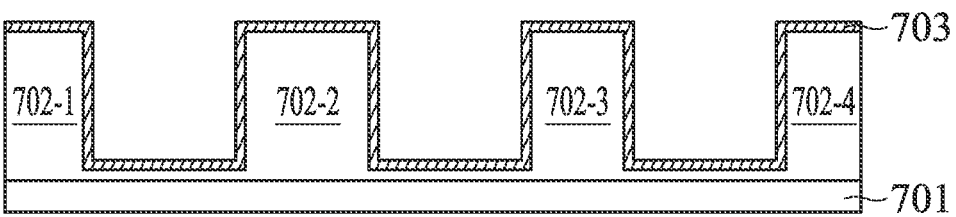
FIG. 7A-G illustrate producing a work function alloy layer of a FinFET device so that the work function alloy layer has regions with a different content of an element of the alloy of the work function alloy layer according to some embodiments.

Device 600 in FIG. 6F may correspond to device 300 in FIG. 3A prior to deposition of work function alloy layer 304 or device 700 in FIG. 7A.

FIG. 7A-G illustrate operations 410 and 412 in FIG. 4.

FIG. 7A shows device 700 which includes substrate 701 and fins 702-1, 702-2, 702-3 and 702-4. Dielectric gate layer 703 is over each of fins 702-1, 702-2, 702-3 and 702-4. Dielectric gate layer 703 follows shapes of each of fins 702-1, 702-2, 702-3 and 702-4 covering side and top surfaces of each of fins 702-1, 702-2, 702-3 and 702-4.

Figure 7B:
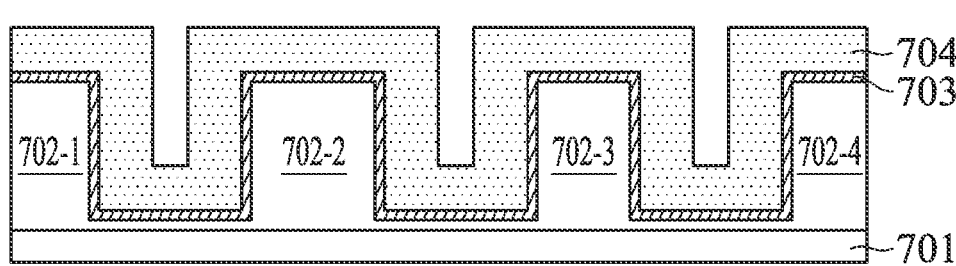

FIG. 7B shows device 700 after deposition of work function alloy layer 704 over dielectric gate layer 703 over each of fins 702-1, 702-2, 702-3 and 702-4. Work function alloy layer 704 follows shapes of each of fins 702-1, 702-2, 702-3 and 702-4 covering side and top surfaces of each of fins 702-1, 702-2, 702-3 and 702-4. Work function alloy layer 704 has the same composition in each of its portions, i.e. for each portion of work function alloy layer 704, a content of each element of the alloy of work function alloy layer 704 is the same. For example, when the alloy of work function alloy layer is an alloy comprising or consisting of Ti, Al, N and C, a content of Ti is the same for each portion of work function alloy layer 704, a content of Al is the same for each portion of work function alloy layer 704, a content of N is the same for each portion of work function alloy layer 704, a content of C is the same for each portion of work function alloy layer 704.

A first protective layer, such as a BARC layer, may be deposited over work function alloy layer 704 over each of fins 702-1, 702-2, 702-3 and 702-4. The first protective layer fills spaces between adjacent pairs of fins, such as 702-1 and 702-2, 702-2 and 702-3, 702-3 and 702-4. The first protective layer has a substantially plain or flat upper surface. A first mask layer, such as a photoresist later, is deposited over a portion of the upper surface of the first protective layer. The portion of the upper surface of the first protective layer defines an underlining portion of work function alloy layer which will become exposed after etching the first protective layer (BARC etching) to remove the portion of the first protective layer not covered by the first mask layer.

Figure 7C:
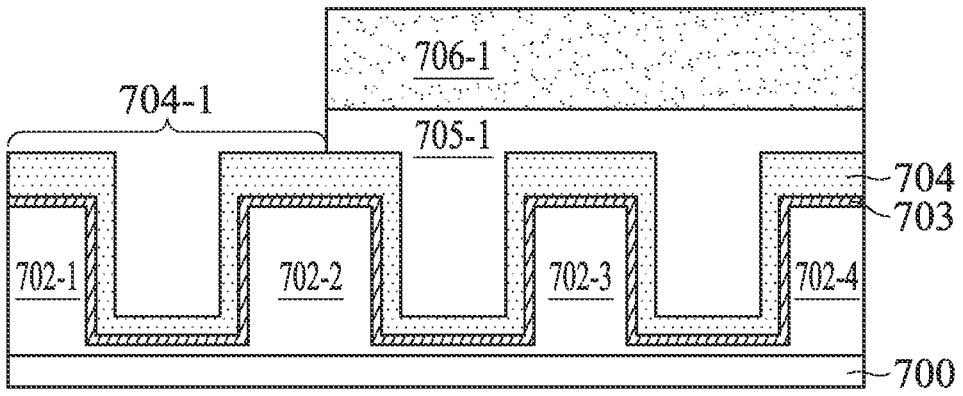

FIG. 7C shows device 700 with first protective layer 705-1 and first mask layer 706-1 after the portion of first protective layer 705-1 not covered by first mask layer 706-1 has been etched away, by for example, dry etching to expose portion 704-1 of work function alloy layer 704. According to FIG. 7C, a right border of exposed portion 704-1 is over top surface of fin structure 702-2 for illustrative purposes only. In certain embodiments, a border of an exposed portion of a work function alloy layer, such as exposed portion 704-1 of work function alloy layer 704, between individual fin structures.

Figure 7D:
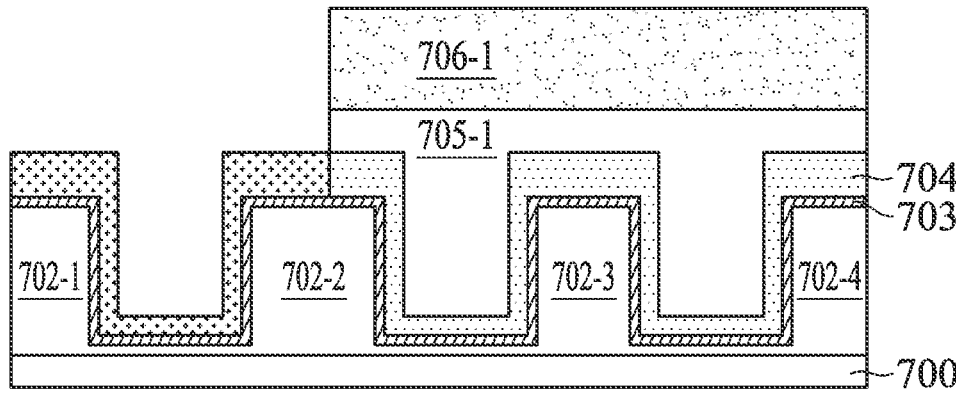

FIG. 7D shows device 700 after subjecting exposed portion 704-1 to wet etching under first wet etching conditions to reduce a content of an etchable element in the alloy of work function alloy layer to a first reduced content. A content of remaining elements, i.e. element(s) other than the etchable elements, of the alloy of work function remains substantially the same. For example, when the alloy of work function alloy layer 704 comprises or consists of Ti, Al, N and C, the wet etching reduces a content of Al in exposed portion 704-1 to a first reduced content, which is smaller than the Al content in deposited work function alloy layer 704, while respective contents of each of Ti, N and C remain substantially the same as they were in deposited work function alloy layer 704. Although FIG. 7D shows both first protective layer 705-1 and first mask layer 706-1 as protecting a part of work function alloy layer 704 other than portion 704-1 from the wet etching, in some embodiments, only first protective material 705-1 may be present as first mask layer 706-1 may be removed. After the wet etching under the first wet etching conditions is complete, first protective material 705-1 and remaining first mask layer 706-1 (if any left) may be removed or ashed away.

Figure 7E:
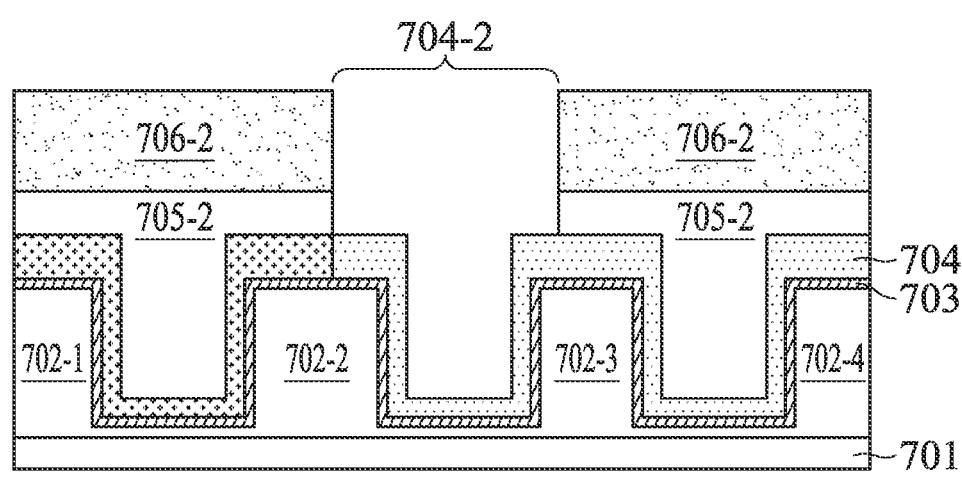
Figure 7F:
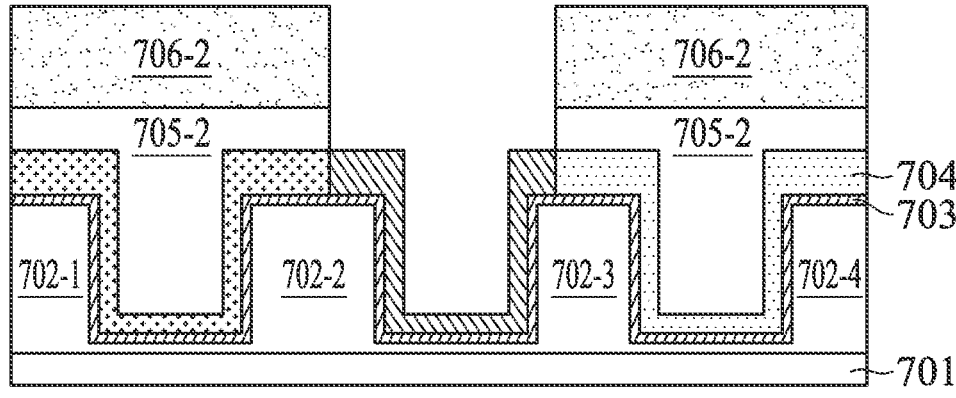

FIG. 7E shows device 700 with second protective layer 705-2 and second mask layer 706-2 after the portion of second protective layer 705-2 not covered by second mask layer 706-2 has been etched away, by for example, dry etching to expose portion 704-2 of work function alloy layer 704. In FIG. 7E, second protective layer 705-2 and second mask layer 706-2 cover portion 704-1 of work function alloy layer 704 previously modified by wet etching FIG. 7F shows device 700 after subjecting exposed portion 704-2 to wet etching under second wet etching conditions (different from the first wet etching conditions) to reduce a content of an etchable element in the alloy of work function alloy layer to a second reduced content, which is different from the first reduced content. A content of remaining elements, i.e. element(s) other than the etchable elements, of the alloy of work function remains substantially the same. Second protective layer 705-2 alone or with any remains of second mask layer 706-2 protect portions 704-1 and 704-3 of work function alloy layer 704 from the wet etching under second wet etching conditions. After the wet etching under the second wet etching conditions is complete, second protective material 705-2 and remaining second mask layer 706-2 (if any left) may be removed or ashed away.

Figure 7G:
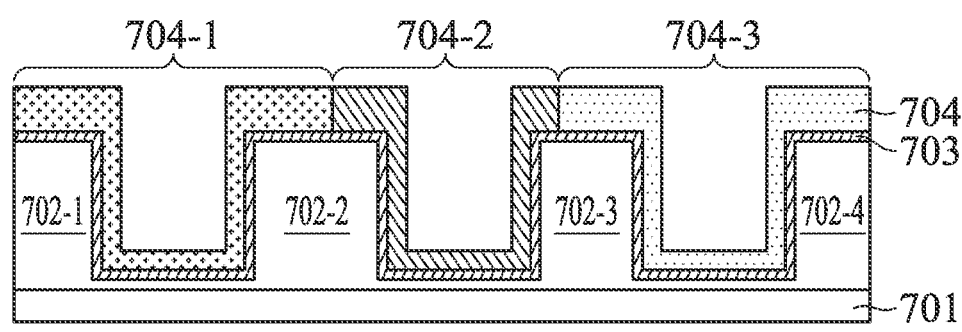

For example, FIG. 7G shows device 700 after such removal. In FIG. 7G, work function alloy layer has portion 704-3 with the original content of the etchable element of the alloy of work function alloy layer 704-3; portion 704-1 with the first reduced content of the etchable element, which is different from the original content; portion 704-2 with the second reduced content of the etchable element, which is different from each of the original content and the first reduced content. Respective contents of remaining element(s), i.e. elements other than the etchable element, of the alloy of work function alloy layer 704 may be substantially the same in each of portions 704-1, 704-2 and 704-3. Due to the different contents of the etchable element, portions 704-1, 704-2 and 704-3 have distinct threshold voltages.

Once work function alloy layer 704 is modified through wet etchings to have multiple distinct threshold voltages metal fill can fill trenches or space between adjacent pairs of individual fin structures, such as fin structures 702-1, 702-2, 702-3 and 702-4.

In one aspect of the present disclosure, a semiconductor device is disclosed. The semiconductor device includes a plurality of fin structures disposed over a substrate; and a work function alloy layer disposed over each fin structure of the plurality of fin structures. A content of a first element in a first portion of the work function alloy layer, is different from a content of the first element in a second portion of the work function alloy layer.

In another aspect of the present disclosure, a method of making a semiconductor device is disclosed. The method involves forming a plurality of fin structures on a substrate.

The method further involves depositing a work function alloy layer over each fin structure of the plurality of fin structures. The work function alloy layer includes a first element. The method also involves forming a first protective layer over a portion of the work function alloy layer over each fin structure of the plurality of fin structures other than a first portion of the work function alloy layer; and reducing a content of the first element in the first portion of the work function alloy layer.

In yet another aspect of the present disclosure, a method of making a semiconductor device is disclosed. The method involves forming a plurality of fin structures on a substrate. The plurality of fin structures includes a first fin structure and a second fin structure. The method further involves depositing a work function alloy layer over each fin structure of the plurality of fin structures. The work function alloy layer contains a first element. The work function alloy layer includes a first portion over the first fin structure and a second portion over the second fin structure. The method also involves reducing a content of the first element in the first portion of the work function alloy layer without modifying a content of the first element in the second portion of the work function alloy layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a semiconductor device, comprising forming a plurality of fin structures on a substrate;

depositing a work function alloy layer over each fin structure of the plurality of fin structures, the work function alloy layer including a first element;

forming a first protective layer over a portion of the work function alloy layer above each fin structure of the plurality of fin structures other than a first portion of the work function alloy layer; and reducing a content of the first element in the first portion of the work function alloy layer, wherein the first element is an etchable element and reducing the content of the first element in the first portion of the work function alloy layer comprises wet etching the first portion of the work function alloy layer.

2. The method of claim 1, wherein the etchable element is Aluminum.

3. The method of claim 2, wherein the work function alloy layer comprises each of Ti, Al, N and C.

4. The method of claim 2, wherein the wet etching comprises exposing the first portion of the work function alloy layer to a basic solution.

5. The method of claim 1, further comprising removing the first protective layer.

6. The method of claim 5, wherein the removing the first protective layer comprises ashing the first protective layer.

7. The method of claim 5, wherein the plurality of fin structures further comprises at least one first fin structure and at least one second fin structure, wherein the first portion of the work function alloy layer is over the at least one first fin structure, and wherein the method further comprises:

forming a second protective layer over a portion of the work function alloy layer above each fin structure of the plurality of fin structures other than a second portion of the work function alloy layer, which second portion is above the at least one second fin structure; and reducing a content of the first element in the second portion of the work function alloy layer, wherein the reduced content of the first element in the second portion of the work function alloy layer is different from the reduced content of the first element in the first portion of the work function alloy layer.

8. The method of claim 1, wherein the plurality of fin structures further comprises at least one first fin structure, wherein the first portion of the work function alloy layer is over the at least one first fin structure, and wherein forming the first protective layer comprises depositing a protective material over each fin structure of the plurality of fin structures, the protective material comprising a first portion which is above the at least one first fin structure, and a remaining portion which is above each fin structure of the plurality of fin structures other than the at least one fin structure;

depositing a mask over the remaining portion of the protective material; and removing the first portion of the protective material, thereby exposing the at least one first fin structure, wherein the remaining portion of the protective material becomes the first protective layer.

9. The method of claim 8, wherein removing the first portion of the protective material comprises dry etching the first portion of the protective material.

10. The method of claim 1, comprising, for each fin structure of the plurality of fin structures, forming a protective layer over a portion of the work function alloy layer above each fin structure of the plurality of fin structures other than a portion of the work function alloy layer above the selected fin structure;

reducing a content of the first element in the portion of the work function alloy layer above the selected fin structure; and removing the protective layer, wherein the reduced content of the first element in the respective portion of the work function alloy layer is different for each fin structure of the plurality of fin structures.

11. The method of claim 10, further comprising depositing a metal fill over the work function alloy layer, wherein for each fin structure of the plurality of fin structures, a portion of the metal fill and the respective portion of the work function alloy layer with the reduced content of the first element form an active gate structure of the respective fin structure of the plurality of the fin structures.

12. A method of making a semiconductor device, comprising forming a plurality of fin structures on a substrate, the plurality of fin structures including a first fin structure and a second fin structure;

depositing a work function alloy layer over each fin structure of the plurality of fin structures, the work function alloy layer containing a first element, the work function alloy layer comprising a first portion over the first fin structure and a second portion over the second fin structure; and reducing a content of the first element in the first portion of the work function alloy layer without modifying a content of the first element in the second portion of the work function alloy layer, wherein the first element is Aluminum and the reducing the content of the first element in the first portion of the work function alloy layer comprises wet etching the first portion of the work function alloy layer.

13. A method of making a semiconductor device, comprising forming a plurality of fin structures on a substrate;

depositing a work function alloy layer over each fin structure of the plurality of fin structures, the work function alloy layer including a first element;

for each fin structure of the plurality of fin structures, forming a protective layer over a portion of the work function alloy layer above each fin structure of the plurality of fin structures other than a portion of the work function alloy layer above the selected fin structure;

reducing a content of the first element in the portion of the work function alloy layer above the selected fin structure; and removing the protective layer, wherein the reduced content of the first element in the respective portion of the work function alloy layer is different for each fin structure of the plurality of fin structures.

14. The method of claim 13, further comprising depositing a metal fill over the work function alloy layer, wherein for each fin structure of the plurality of fin structures, a portion of the metal fill and the respective portion of the work function alloy layer with the reduced content of the first element form an active gate structure of the respective fin structure of the plurality of the fin structures.

15. The method of claim 13, wherein the first element is an etchable element and reducing the content of the first element in the portion of the work function alloy layer above the selected fin structure comprises wet etching the portion of the work function alloy layer above the selected fin structure.

16. The method of claim 15, wherein the etchable element is Aluminum.

17. The method of claim 16, wherein the work function alloy layer comprises each of Ti, Al, N and C.

18. The method of claim 15, wherein the wet etching comprises exposing the portion of the work function alloy layer above the selected fin structure to a basic solution.

19. The method of claim 13, wherein the removing the protective layer comprises ashing the protective layer.

20. The method of claim 13, wherein the plurality of fin structures further comprises at least one first fin structure, and wherein forming the protective layer comprises depositing a protective material over each fin structure of the plurality of fin structures, the protective material comprising a first portion which is above the at least one first fin structure, and a remaining portion which is above each fin structure of the plurality of fin structures other than the at least one fin structure;

depositing a mask over the remaining portion of the protective material; and removing the first portion of the protective material, thereby exposing the at least one first fin structure, wherein the remaining portion of the protective material becomes the first protective layer.

\* \* \* \* \*